United States Patent [19]
Alton et al.

[11] Patent Number: 5,311,486
[45] Date of Patent: May 10, 1994

[54] TIMING GENERATION IN AN AUTOMATIC ELECTRICAL TEST SYSTEM

[75] Inventors: Timothy Alton, San Jose; R. Warren Necoechea, Fremont, both of Calif.

[73] Assignee: LTX Corporation, Westwood, Mass.

[21] Appl. No.: 943,881

[22] Filed: Sep. 11, 1992

[51] Int. Cl.$^5$ .................. G04B 47/00; G04F 8/00; G01R 31/28
[52] U.S. Cl. ........................ 368/10; 368/113; 324/73.1; 324/158 R; 371/15.1; 371/22.1
[58] Field of Search ............ 368/10, 113, 117-120; 324/73.1, 158 R; 371/15.1, 22.1, 22.2, 22.3, 22.6, 25.1, 27

[56] References Cited
U.S. PATENT DOCUMENTS

| | | | |
|---|---|---|---|
| 4,070,565 | 1/1978 | Borrelli | 235/302 |
| 4,108,358 | 8/1978 | Niemasztk et al. | 235/302 |
| 4,792,932 | 1/1987 | Bowllers et al. | 368/113 |
| 4,994,732 | 2/1991 | Jeffrey et al. | 324/73.1 |
| 5,212,443 | 5/1993 | West et al. | 324/158 R |
| 5,254,942 | 10/1993 | D'Souza et al. | 324/158 R |

*Primary Examiner*—Vit W. Miska
*Attorney, Agent, or Firm*—Blakely, Sokoloff, Taylor & Zafman

[57] ABSTRACT

A method and apparatus for generating timing markers in an automatic electrical test system. Timing parameters are synchronized by an external period start signal corresponding to a centrally generated external period and an internal period start signal generated locally for each input/output pin. The timing parameters comprise T1 counter and vernier values, T2 counter and vernier values, and period-minus-T1 counter and period vernier values.

27 Claims, 6 Drawing Sheets

TIMING GENERATION IN AN AUTOMATIC ELECTRICAL TEST SYSTEM

FIELD OF THE INVENTION

The present invention pertains to the field of automatic electrical test systems. More particularly, this invention relates to timing generation in automatic electrical test systems.

BACKGROUND OF THE INVENTION

Integrated circuit devices are tested after fabrication to ensure device performance according to functional specifications. Typically, an automatic electrical test system is programmed to provide an integrated circuit device with a simulated operating environment. Very-large-scale-integration (VLSI) devices require an automatic electrical test system capable of processing a large number of high speed input/output pins.

In a typical automatic electrical test system, timing parameters for a waveform are specified by a T1 marker and a T2 marker. The T1 marker and the T2 marker correspond to edges of the waveform in relation to a tester cycle. The T1 marker is specified by a T1 counter value and a T1 vernier value. A vernier is an auxiliary device for giving a piece of apparatus a higher adjustment accuracy. The T1 counter value and a T1 vernier value determine the T1 marker offset from the start of a tester cycle. The T2 marker is specified by a T2 counter value and a T2 vernier value. The T2 counter value and a T2 vernier value determine the T2 marker offset from the T1 marker or the start of the tester cycle.

In prior automatic electrical test systems, the tester cycles are typically generated by a central period generator. The central period generator is typically comprised of a base period generator and a period counter. The period counter is driven by a base period signal generated by the base period generator. The period counter is loaded with a tester period count and driven down to a terminal count, thereby generating a period start signal for a tester cycle. The central period generator distributes the period start signal and the base period signal to the marker generators for the output pins of the automatic electrical test system. The central period generator also distributes a period vernier value to the marker generators. The period vernier value is used to interpolate the period start signal in order to improve timing resolution.

In each marker generator, a T1 counter is loaded with the T1 counter value for the output pin. The T1 counter is driven by the base period signal received from the central period generator. The period start signal received from the central period generator causes the T1 counter to count down and generate a T1 terminal count signal.

Timing vernier circuits subdivide the base period signal in order to produce high resolution for the timing signals. The T1 terminal count signal is coupled to a T1 vernier circuit that interpolates the T1 terminal count signal according to the T1 vernier value for the output pin. The distributed period vernier value is used to modify the marker vernier values.

Past automatic electrical test systems that generate and distribute the period start signal and the period vernier value from a central period generator typically have disadvantages, however. The T1 vernier value and the period vernier value can compound the inaccuracies caused by the nonlinear analog nature of vernier circuits having a large span. Also, the linearity of the vernier circuits can vary between output pins, thereby increasing skew among the waveforms.

Moreover, the distribution of the period start signal typically requires a high bandwidth distribution tree because the tester period is typically programmable over a wide range. In addition, the distribution of the period vernier value from the central period generator to all of the marker generators typically increases the pin count of the automatic electrical test system components.

Past automatic electrical test systems that generate and distribute the period start signal from a central period generator cannot typically generate markers across multiple tester cycles boundaries unless multiple T1 counters are implemented in the marker generators. In such systems, a T1 counter is typically triggered on each cycle boundary in order to generate markers for the intervening cycles. If the multiple T1 counters are not implemented, marker generation across cycle boundaries would preclude on the fly changes in tester periods. Unfortunately, the multiple high speed T1 counters typically required by prior systems increase the cost and complexity of the automatic electrical test system hardware.

SUMMARY AND OBJECTS OF THE INVENTION

One object of the present invention is to generate timing markers in an automatic electrical test system.

Another object of the present invention is to generate T1 and T2 timing markers and enable on the fly selection of timing periods within an automatic electrical test system.

Another object of the present invention is to generate timing periods locally for each pin of the automatic electrical test system to avoid distribution of timing periods from a central location.

Another object of the present invention is to generate accurate T1 and T2 timing markers while avoiding the non linearities caused by vernier circuits having a large span value.

Another object of the present invention is to generate a high frequency base period signal locally for each pin of an automatic electrical test system.

Another object of the present invention is to accumulate period vernier values locally for each pin of an automatic electrical test system before applying marker verniers.

A further object of the present invention is to enable marker crossing of multiple period cycle boundaries without implementing multiple marker counters for each pin of an automatic electrical test system.

These and other objects of the invention are provided by a method and apparatus for generating timing markers in an automatic electrical test system. A timing generator receives timing parameters synchronized by an external period start signal corresponding to a centrally generated external period. The timing parameters comprise T1 counter and vernier values, T2 counter and vernier values, and period-minus-T1 counter and period vernier values. The period-minus-T1 values equal the external period minus the T1 value resolved to the least significant bit of the counter.

An internal period start is generated by adding the T1 counter value for the current period to the period-minus-T1 counter value for the previous period. The period vernier values for the previous periods are accumulated and added to the T1 and T2 vernier values for the current period. The T1 marker is generated offset from the internal period start by the T1 counter value and delayed by the sum of the accumulated period vernier and the T1 vernier value. The T2 marker is generated offset from the internal period start by the T2 counter value and delayed by the sum of the accumulated period vernier and the T2 vernier value.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
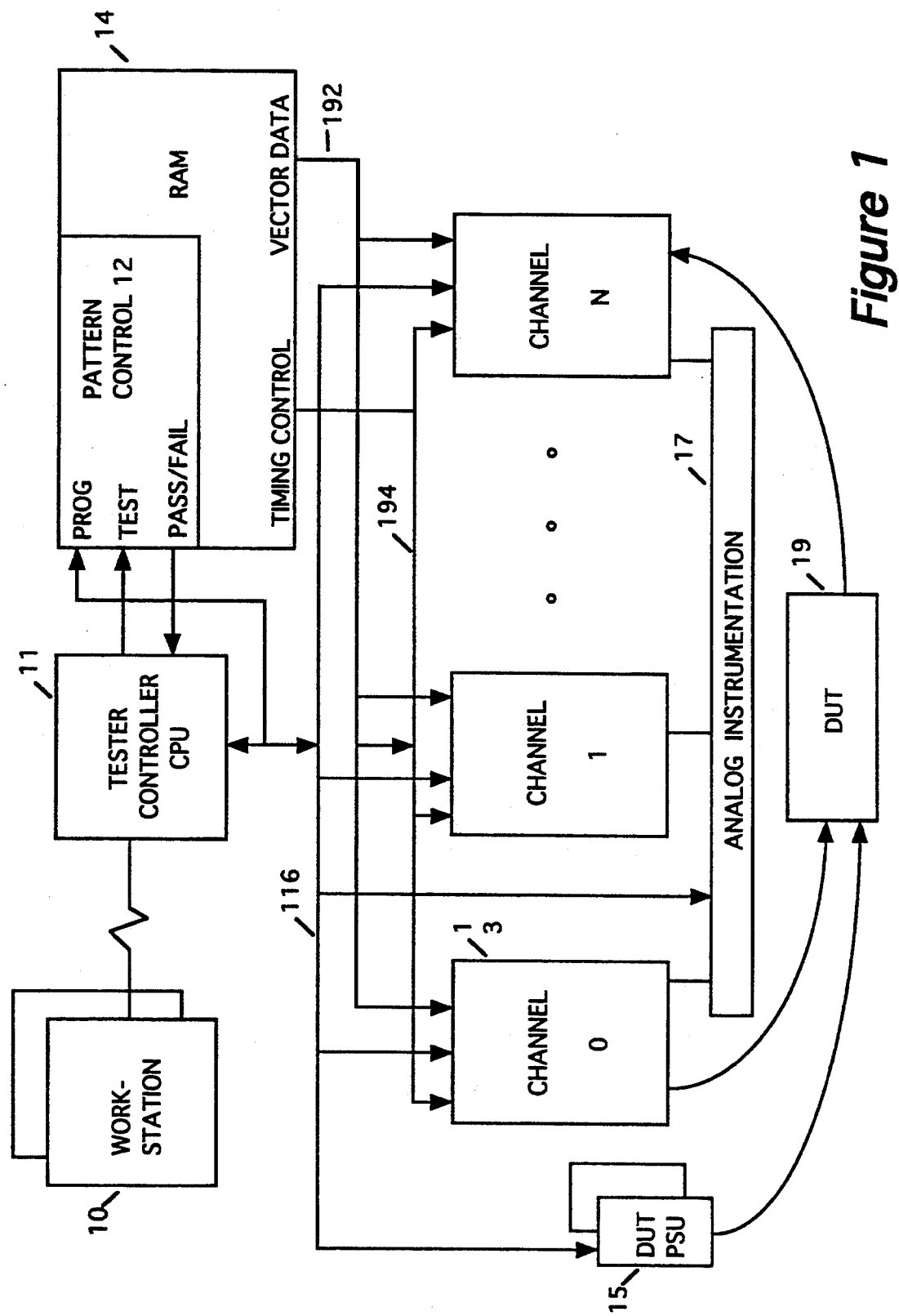
FIG. 1 is a block diagram illustrating the major elements of an automatic electrical test system, including a user workstation, a tester controller, a tester vector RAM, a set of tester pin channels, and circuitry for coupling to the device under test.

FIG. 1 is a block diagram illustrating the major elements of an automatic electrical test system. The diagram shows an example device under test (DUT) 19 coupled for testing. A workstation 10 is coupled for communication over a network to a tester controller CPU 11. The workstation 10 enables a user to develop and execute test programs and analyze results. The tester controller CPU 11 is a computer resource for managing test program loading and execution, as well as results extraction, system calibration, and diagnostics. The CPU 11 loads test programs over a data bus 116.

A pattern control block 12 performs real-time test program execution, and provides the addresses for stimulus source and expected response data. A tester vector RAM 14 stores vector data and timing control. The vector data portion of the tester vector RAM 14 stores the stimulus and expected response values to be applied to the device under test on a cycle by cycle basis. The timing control portion of the tester vector RAM 14 stores an entry per vector that determines the timing of the formatted stimulus at the device under test, as well as the strobe timing and fail masking of the response from the device under test 19.

A set of pin channel circuits (channel 0 through channel N) contain the timing generators and formatters for shaping the stimulus, and pin drivers for interfacing to the device under test 19 at programmable levels. The pin channel circuits also contain the timing generators for strobing the device under test response after the response passes through programmable level comparators. In the example shown, channel 0 provides the stimulus to the device under test 19, and channel N measures the response.

A DUT PSU circuit 15 provides programmable power sources for the device under test 19. An analog instrumentation circuit 17 enables precision stimulus and measurement capabilities for voltage, current, and time at the device under test 19.

Figure 2:
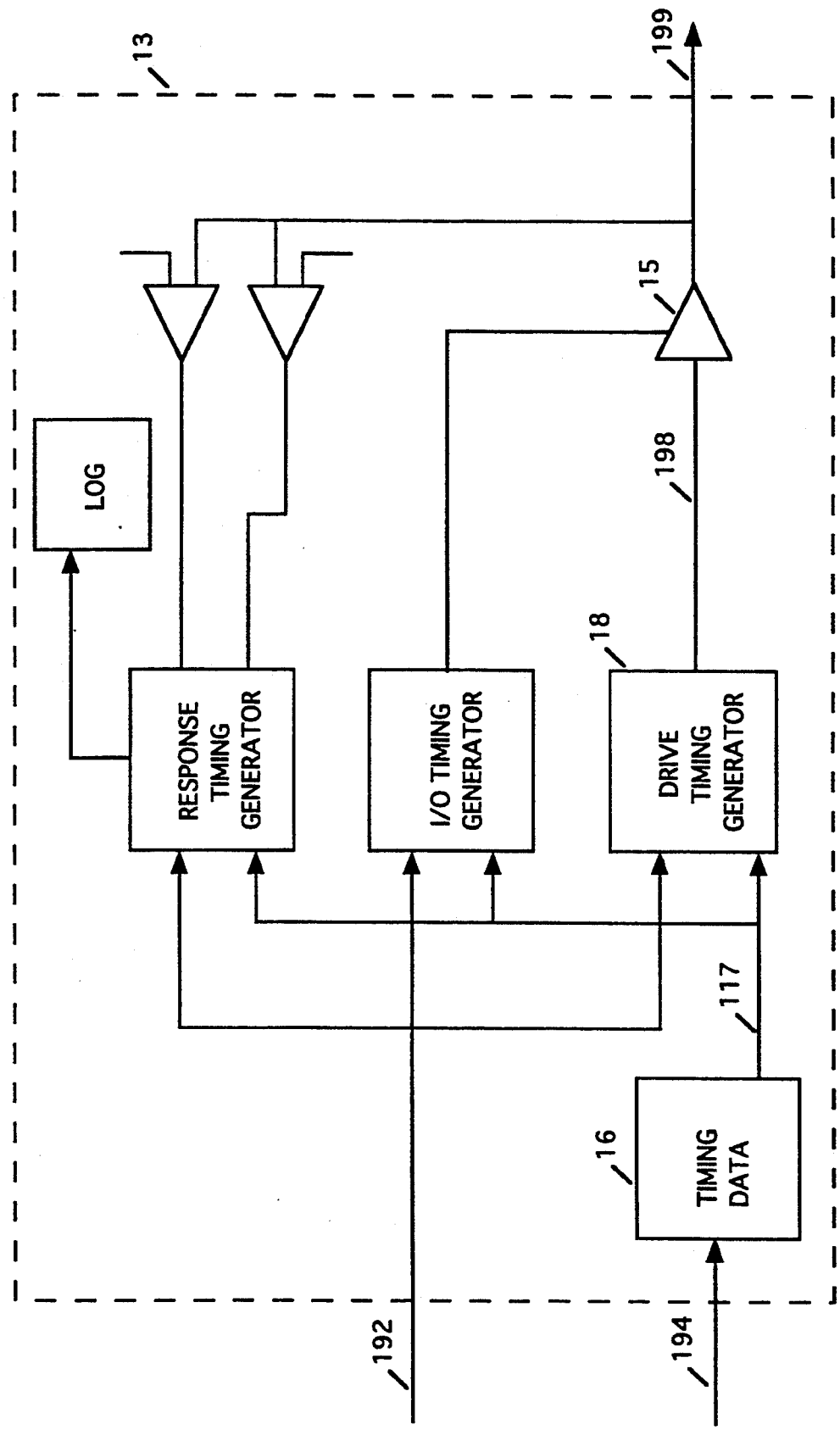
FIG. 2 is a block diagram illustrating an example tester pin channel, and shows a timing data RAM, a set of timing generator circuits, and electronics for transmitting and receiving signals over the corresponding pin of the automatic electrical test system.

FIG. 2 is a diagram illustrating an example pin channel circuit 13 corresponding to channel 0. A timing data memory 16 stores timing data addresses for selecting the timing parameters for the timing generators. The timing data memory 16 is coupled to receive timing control over signal lines 194. The timing data memory 16 is coupled to transmit timing parameter addresses over signal lines 117. For one embodiment, the timing parameter addresses 117 comprises 6 bits.

An output buffer 15 is coupled to transmit an output signal to the device under test 19 over signal line 199. The pin channel circuit 13 includes a response timing generator circuit, an I/O timing generator circuit, and a drive timing generator circuit 18. The timing generator circuits perform timing generation in a substantially similar manner, which is discussed below for the drive timing generator circuit 18.

Figure 3:
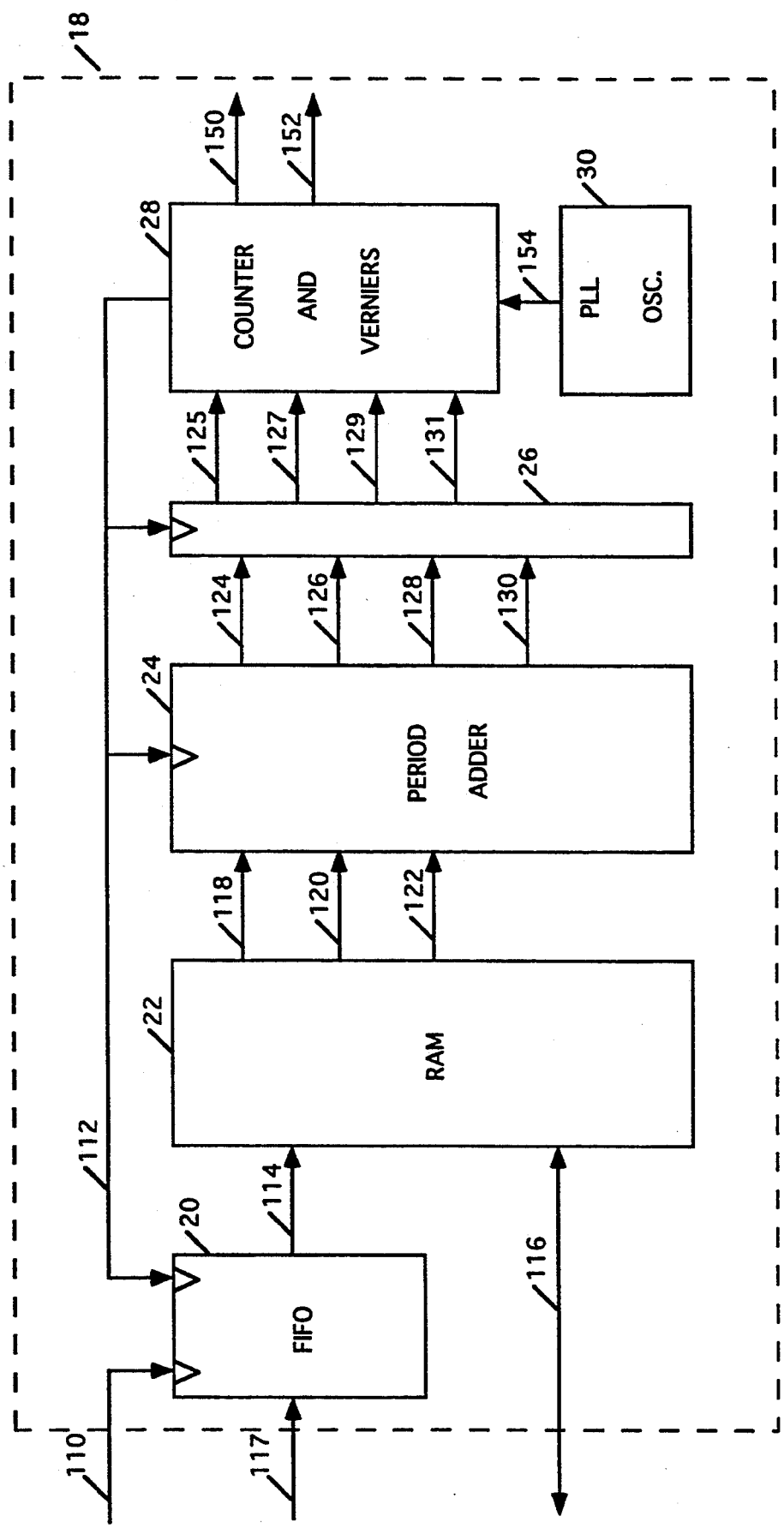
FIG. 3 is a block diagram of an example timing generator, which receives timing parameters synchronized by an external period signal, and which generates T1 and T2 markers that define edges of a waveform or strobe placement.

FIG. 3 is a block diagram of the timing generator circuit 18 corresponding to the example pin channel circuit 13. The timing generator circuit 18 generates T1 and T2 markers that define edges of a waveform. The timing generator circuit 18 is comprised of a first in first out (FIFO) memory 20, a random access memory (RAM) 22 for storing timing parameters, a period adder circuit 24, a pipeline stage register 26, a counters and verniers circuit 28, and a phase locked loop oscillator (PLL OSC) 30.

Timing signals are referenced to an external period signal 110 and an internal period signal 112. The external period signal 110 is distributed to all pins of the automatic electrical test system. The external period signal 110 defines external periods for the automatic electrical test system. Each external period corresponds to a set of timing parameter that defines a pair of T1 and T2 markers for a waveform. The internal period signal 112 defines internal periods for synchronizing timing parameter flow locally through the timing generator circuit 18. The internal period signal 112 also retriggers the counters that generate the T1 and T2 markers.

The FIFO 20 stores timing parameter addresses for accessing the RAM 22. The FIFO 20 is coupled to receive the timing parameter addresses over signal lines 117. The external period signal 110 synchronizes the timing parameter addresses 117 for storage in the FIFO 20. The FIFO 20 generates a timing parameter address over signal lines 114. The timing parameter address 114 is synchronized by the internal period signal 112. For one embodiment, the FIFO 20 stores up to 16 timing parameter address entries of 13 bits in each entry.

The RAM 22 stores multiple entries of timing parameters, each entry defining a pair of T1 and T2 markers for a waveform. Each entry of timing parameters corresponds to an external period. A timing parameter entry comprises a T1 value, a T2 value, and a period-minus-T1 value. The T1 value defines the T1 marker offset from the start of the corresponding external period. The T2 value defines the T2 marker offset from the T1 marker. The period-minus-T1 value equals the corresponding external period minus the T1 marker offset from the start of the corresponding external period.

The RAM 22 is coupled to receive the timing parameter address 114 from the FIFO 20. The timing parameter address 114 selects one of the timing parameter entries stored in the RAM 22. A timing parameter entry is selected from the RAM 22 for each internal period since the timing parameter address 114 is synchronized by the internal period signal 112. The sequence of timing parameter entries selected from the RAM 22 is determined by the sequence of timing parameter addresses 117 received by the FIFO 20.

For one embodiment, the RAM 22 stores 64 entries of timing parameters. The T1 value, the T2 value, and the period-minus-T1 value each comprise 20 bits. The T1 value and the T2 value are each comprised of a 13 bit counter value and a 7 bit vernier value. The period-minus-T1 value is comprised of a 14 bit counter value and a 6 bit vernier value. The period-minus-T1 value is a signed number, while the T1 value and the T2 value are each unsigned numbers. The RAM 22 is coupled to transfer the timing parameters over the data bus 116.

The following equation illustrates the relationship between T1 markers in adjacent cycles: $DT1(n) = T1(n) + P(n-1) - T1(n-1)$, where $T1(n)$ is the T1 value programmed in the RAM 22 for cycle n, $P(n-1)$ is the programmed value for the period in cycle $n-1$, and $T1(n-1)$ is the programmed value for T1 in cycle $n-1$. The equation applies to counter values only. For one embodiment, the equation has a 1.25 nanosecond resolution.

The period adder circuit 24 is coupled to receive a T1 over signal lines 118, a T2 over signal lines 120, and a period-minus-T1 over signal lines 122 from the RAM 22. The T1 118, the T2 120, and the period-minus-T1 122 carry the timing parameter from the entry in the RAM 22 selected by the timing parameter address 114. The T1 118 carries the T1 value, the T2 120 carries the T2 value, and the period-minus-T1 122 carries the period-minus-T1 value.

The period adder circuit 24 generates an accumulated T1 vernier over signal lines 124, an accumulated T2 vernier over signal lines 126, a T1 count over signal lines 128, and a T2 count over signal lines 130. The accumulated T1 vernier 124 is a combination of the T1 vernier value for the current external period and the accumulated period vernier values for the previous external periods. The accumulated T2 vernier 126 is a combination of the T2 vernier value for the current external period and the accumulated period vernier values for the previous external periods. The T1 count 128 is a combination of the T1 counter value for the current external period and the period-minus-T1 counter value for the previous external period. The T2 count 130 is the T2 counter value for the current external period.

The pipeline stage register 26 receives timing vector information for an external period from the period adder circuit 24, while distributing timing vector information for the previous external period to the counters and verniers circuit 28. The pipeline stage register 26 is synchronized by the internal period signal 112. The pipeline stage register 26 is coupled to receive the accumulated T1 vernier 124, the accumulated T2 vernier 126, the T1 count 128, and the T2 count 130. The pipeline stage register 26 is coupled to distribute delayed timing vector information comprising an accumulated T1 vernier 125, an accumulated T2 vernier 127, a T1 count 129, and a T2 count 131 to the counters and verniers circuit 28.

The counters and verniers circuit 28 generates a T1 marker over signal line 150 and a T2 marker over signal line 152. The counters and verniers circuit 28 generates the internal period signal 112 for synchronizing timing parameter flow locally through the timing generator, and for retriggering the counters contained within the counters and verniers circuit 28 that generate the T1 and T2 markers.

The counters and verniers circuit 28 is coupled to receive a base clock over signal line 154 from the PLL OSC 30. The base clock 154 synchronizes the counters contained within the counters and verniers circuit 28. For one embodiment, the base clock 154 runs at a frequency of 800 megahertz, which yields a base counter resolution of 1.25 nanoseconds.

Figure 4:
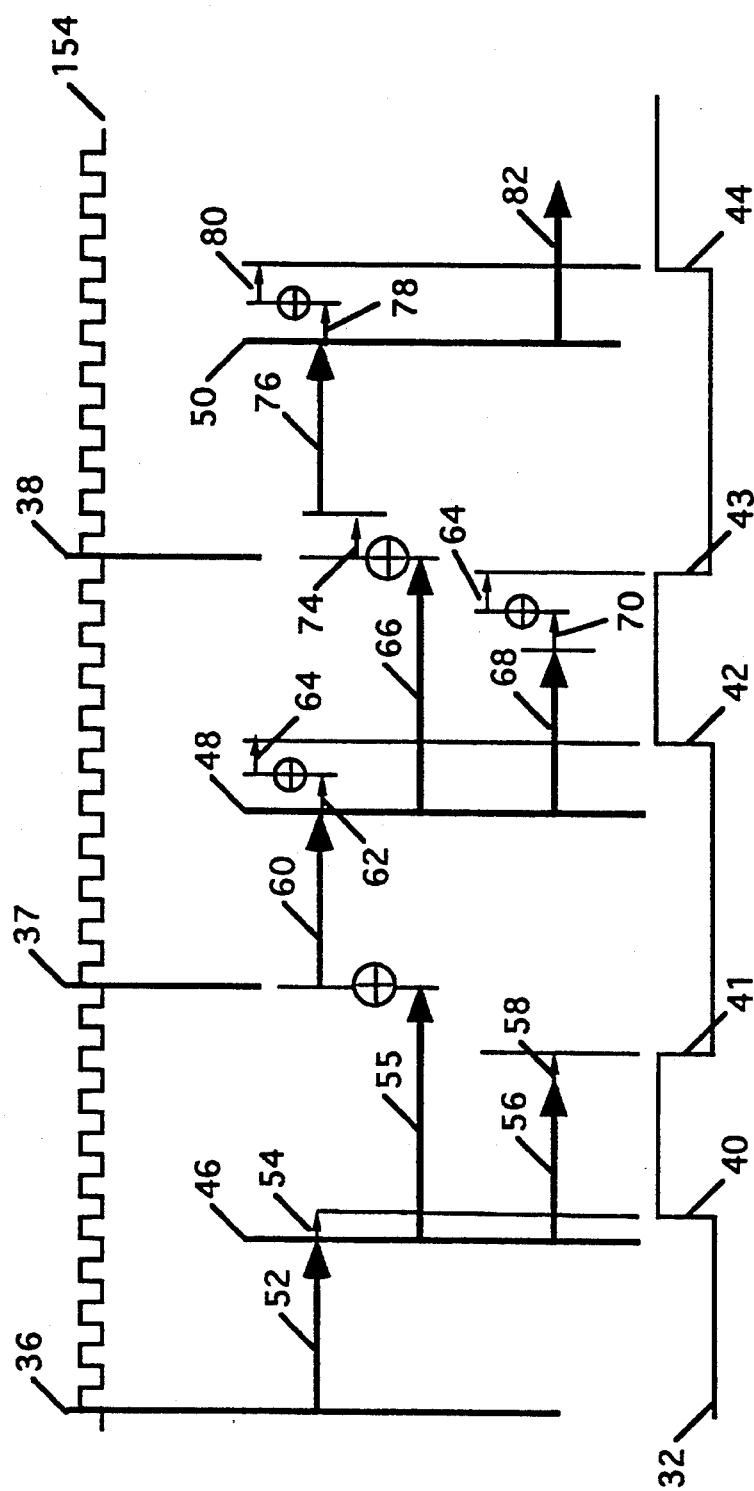
FIG. 4 illustrates the relationship between the internal periods, the external periods, the base clock, and the counter and vernier values for an example waveform.

FIG. 4 illustrates the relationship between the internal periods, the external periods, and the counter and vernier values for an example waveform 32. Also shown is the base clock 154 generated by the PLL OSC 30. The external period signal 110 divides the tester waveform 32 into successive external periods. Time 36 is the start of the first external period; time 37 is the start of the second external period; and time 38 is the start of the third external period.

The tester waveform 32 includes a series of pulses defined by successive sets of T1 and T2 markers. In the example shown, the tester waveform 32 has a pulse defined within each external period. A waveform edge is defined by a T1 marker 40 for the first external period, and a waveform edge is defined by a T2 marker 41 for the first external period. Similarly, a waveform edge is defined by a T1 marker 42 for the second external period, and a waveform edge is defined by a T2 marker 43 for the second external period.

A first internal period start 46 is offset from the first external period start 36 by a T1 counter value 52. The T1 counter value 52 corresponds to the first external period. The T1 marker 40 is offset from the first external period start 36 by a combination of the T1 counter value 52 with a T1 vernier value 54. The T1 counter value 52 and the T1 vernier value 54 corresponds to the first external period. The T2 marker 41 is offset from the first internal period start 46 by a combination of a T2 counter value 56 with a T2 vernier value 58. The T2 counter value 56 and the T2 vernier value 58 correspond to the first external period.

A second internal period start 48 is offset from the first internal period start 46 by the sum of a period-minus-T1 counter value 55 with a T1 counter value 60. The period-minus-T1 counter value 55 corresponds to the first external period, and the T1 counter value 60 corresponds to the second external period. The T1 marker 42 is offset from the second internal period start 48 by a combination of a T1 vernier value 62 with an accumulated period vernier value 64. The T1 vernier value 62 corresponds to the second external period. The accumulated period vernier value 64 equals the period vernier value corresponding to the first external period. The T2 marker 43 is offset from the second internal period start 48 by the sum of the accumulated period vernier value 64 with a combination of a T2 counter value 68 with a T2 vernier value 70. The T2 counter value 68 corresponds to the second external period, and the T2 vernier value 70 corresponds to the second external period.

A third internal period start 50 is offset from the second internal period start 48 by the sum of a period-minus-T1 counter value 66 and a T1 counter value 76 and a vernier accumulator carry 74. The period-minus-T1 counter value 66 corresponds to the second external period, and the T1 counter value 76 corresponds to the third external period. The vernier accumulator carry 74 results from a carry out of the adder that accumulates the period vernier values. The vernier accumulator carry 74 equals one period of the base clock 154. The T1 marker 44 is offset from the third internal period start 50 by a combination of a T1 vernier value 78 with an accumulated period vernier value 80. The accumulated period vernier value 80 equals the period vernier value corresponding to the first external period plus the period vernier value corresponding to the second external period minus the accumulator carry 74. The T1 vernier value 78 corresponds to the third external period.

Figure 5:
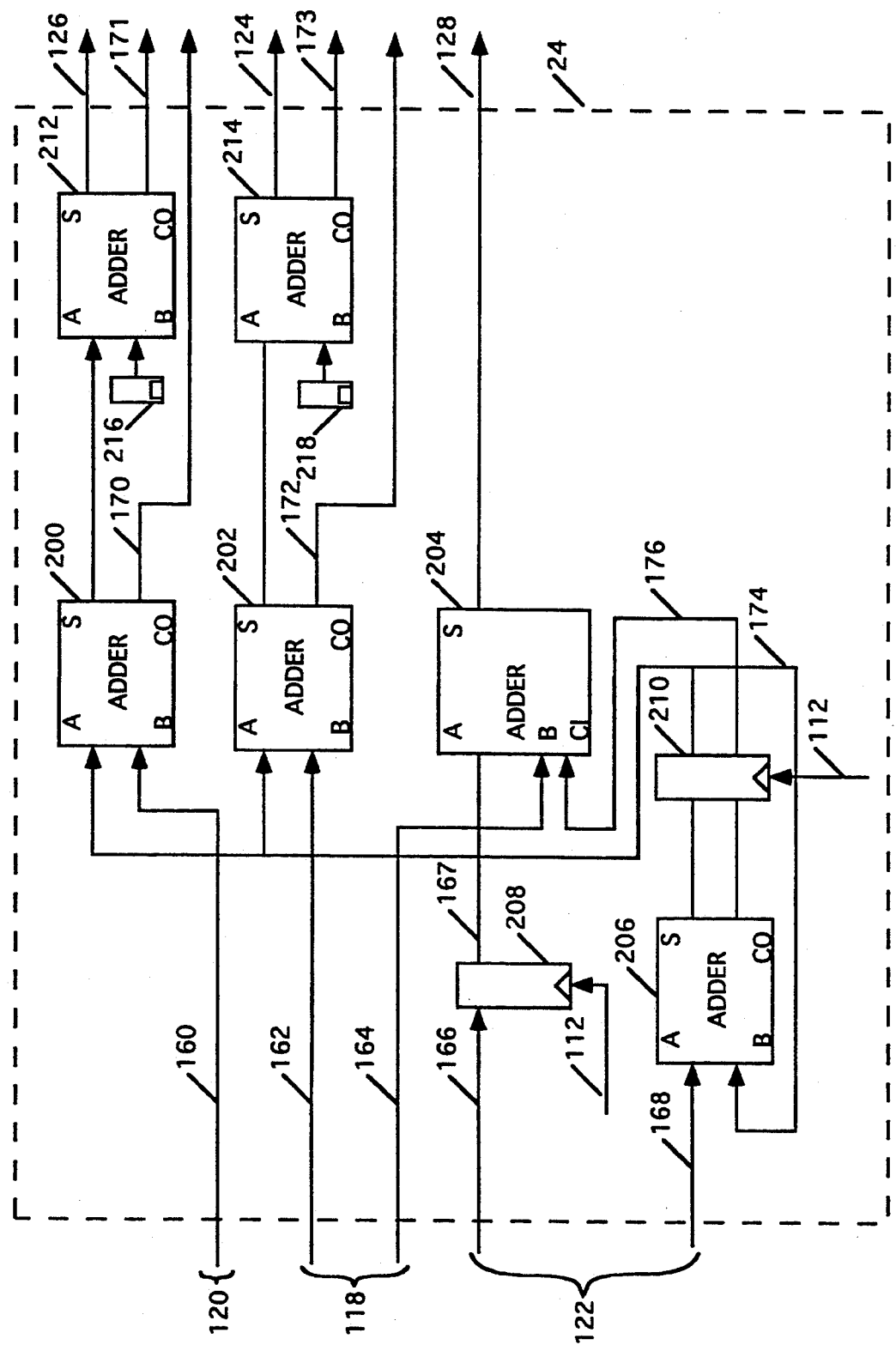
FIG. 5 is a block diagram illustrating the period added circuit, which is coupled to receive a T1, a T2, and a period-minus-T1 timing parameter, and which generates accumulated T1 and T2 vernier values, a modified T1 counter value, and accumulated period vernier values.

FIG. 5 is a block diagram illustrating the period adder circuit 24. The period adder circuit 24 is coupled to receive the T1 118, the T2 120, and the period-minus-T1 122 timing parameter from the entry in the RAM 22 selected by the timing parameter address 114. The T1 118 comprises a T1 counter value 164 and a T1 vernier value 162. The T2 120 comprises the T2 count 130 and a T2 vernier value 160. The period-minus-T1 122 comprises a period-minus-T1 counter value 166 and a period vernier value 168.

An adder 206 and a pipeline register 210 are coupled to generate an accumulated period vernier value 174. The adder 206 is coupled to receive the period vernier value 168 from the RAM 22. The adder 206 generates the sum of the period vernier value 168 and the accumulated period vernier value 174. The accumulated period vernier value 174 is the output sum (S) of the adder 206 delayed for one internal period by the pipeline register 210. The pipeline register 210 is synchronized by the internal period clock signal 112. The adder 206 and the pipeline register 210 also generate an accumulated period-minus-T1 carry out 176 if the accumulated period vernier value 174 exceeds the range of the adder 206. For one embodiment, the adder 206 is a 6-bit adder.

An adder 200 and an adder 212 are coupled to generate the accumulated T2 vernier 126. The adder 200 generates the sum (S) of the accumulated period vernier value 174 and the T2 vernier value 160 received from the RAM 22. The adder 200 adds in a calibration offset 216 to the accumulated T2 vernier 126. The calibration offset 216 is adjusted to eliminate skew between rising or falling edges at the device under test. For one embodiment, the adder 200 is a 6-bit adder, and the adder 212 is a 7-bit adder.

Similarly, an adder 202 and an adder 214 are coupled to generate the accumulated T1 vernier 124. The adder 202 generates the sum (S) of the accumulated period vernier value 174 and the T1 vernier value 162 received from the RAM 22. The adder 214 adds in a calibration offset 218 to the accumulated T1 vernier 124. The calibration offset 218 is adjusted to eliminate skew between rising or falling edges at the device under test. For one embodiment, the adder 202 is a 6-bit adder, and the adder 214 is a 7-bit adder.

The adder 200 generates a carry over signal line 170 if the sum of the accumulated period vernier value 174 and a T2 vernier value 160 exceeds the range of the adder 200. The adder 212 generates a carry over signal line 171 if the addition of the calibration offset 216 exceeds the range of the adder 212. The adder 202 generates a carry over signal line 172 if the sum of the accumulated period vernier value 174 and a T1 vernier value 162 exceeds the range of the adder 202. The adder 214 generates a carry over signal line 173 if the addition of the calibration offset 218 exceeds the range of the adder 214. As will be described, the carry 170, the carry 171, the carry 172, and the carry 173 are used to shift the T1 marker and the T2 marker by 0, 1, or 2 periods of the base clock 154.

An adder 204 and a pipeline register 208 are coupled to generate the T1 count 128. The pipeline register 208 is coupled to receive the period-minus-T1 counter value 166 from the RAM 22. The pipeline register 208 delays the period-minus-T1 counter value 166 for one internal period. The pipeline register 208 is synchronized by the internal period signal 112. The adder 204 is coupled to receive the T1 counter value 164 from the RAM 22 and a delayed period-minus-T1 counter value 167 from the pipeline register 208. The adder 204 generates the T1 count 128 by summing the T1 counter value 164 and the delayed period-minus-T1 counter value 167.

Figure 6:
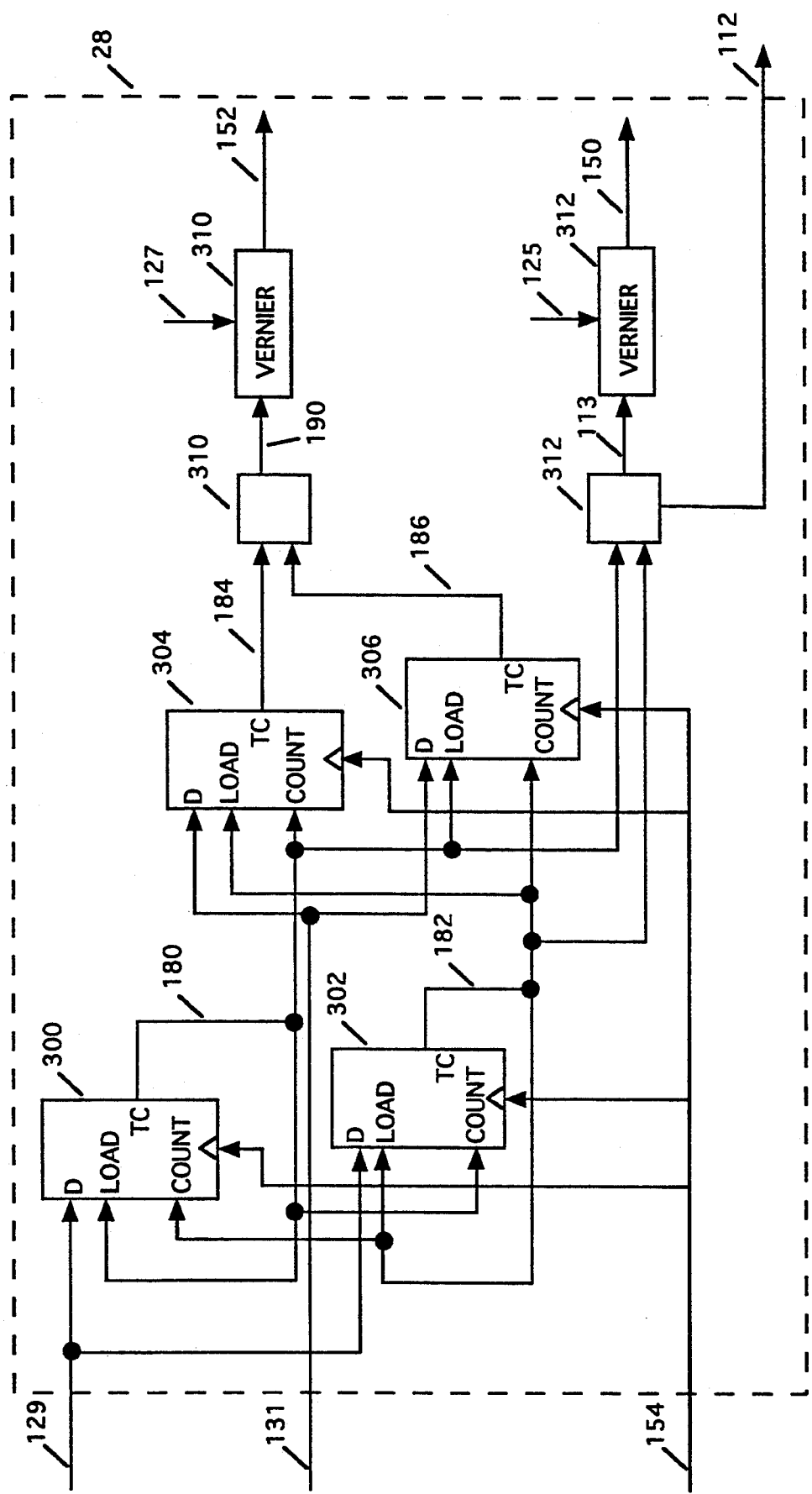
FIG. 6 is a block diagram illustrating the counters and verniers circuit, which receives the modified T1 and the T2 counter values, and the accumulated T1 and T2 vernier values, and which generates the internal period signal and the T1 and T2 markers.

FIG. 6 is a block diagram illustrating the counters and verniers circuit 28. A counter 300, a counter 302, and a delay circuit 312 are coupled to generate the internal period signal 112. The internal period signal 112 is the T1 terminal count. A counter 304, a counter 306, and a delay circuit 310 are coupled to generate a T2 terminal count 190. Two counters are employed for the T1 marker and the T2 marker to eliminate dead time and minimize retrigger time.

The counter 300 and the counter 302 are coupled to receive and store the T1 count 129. The counter 300 and the counter 302 are synchronized by the base clock 154. A terminal count 180 of the counter 300 causes the counter 300 to load the T1 count 129. The terminal count 180 causes the counter 302 to count down. A terminal count 182 of the counter 302 causes the counter 302 to load the T1 count 129. The terminal count 182 causes the counter 300 to count down. Thus, the counter 300 counts down while the counter 302 is loaded with the T1 count 129. Similarly, the counter 302 counts down while the counter 300 is loaded with the T1 counter value 129.

The delay circuit 312 is coupled to receive the terminal count 180 and the terminal count 182. The delay circuit 312 generates the internal period signal 112 without delay. The internal period signal 112 is the logical OR of the terminal counts 180 and 182. The delay circuit 312 also generates a T1 coarse marker 113 by delaying the terminal count 180 and the terminal count 182 by 0, 1, or 2 periods of the base clock 154 according to the carry 172 and the carry 173 generated by the period adder circuit 24. If the carry 172 and the carry 173 are zero, the terminal count 180 and the terminal count 182 are not delayed. If only one of the carry 172 and the carry 173 is one, the terminal count 180 and the terminal count 182 are delayed by one period of the base clock 154. If both of the carry 172 and the carry 173 are one, the terminal count 180 and the terminal count 182 are delayed by two periods of the base clock 154.

A vernier circuit 312 is coupled to receive the T1 coarse marker 113 and the accumulated T1 vernier 125. The vernier circuit 312 adjusts the phase of the T1 coarse marker 113 according to the accumulated T1 vernier 125 in order to generate the T1 marker 150.

The counter 304 and the counter 306 are coupled to receive and store the T2 count 131. The counter 304 and the counter 306 are synchronized by the base clock 154. The terminal count 180 causes the counter 306 to load the T2 count 131. The terminal count 180 causes the counter 304 to count down. The terminal count 182 causes the counter 304 to load the T2 count 131. The terminal count 182 causes the counter 306 to count down. Thus, the counter 304 counts down while the counter 306 is loaded with the T2 count 131. Similarly, the counter 306 counts down while the counter 304 is loaded with the T2 count 131.

The delay circuit 310 is coupled to receive a terminal count 184 from the counter 304 and a terminal count 186 from the counter 306. The delay circuit 310 generates the T2 terminal count 190 by delaying the terminal count 184 and the terminal count 186 by 0, 1, or 2 periods of the base clock 154 according to the carry 170 and the carry 171 generated by the period adder circuit 24. If the carry 170 and the carry 171 are zero, the terminal count 184 and the terminal count 186 are not delayed. If only one of the carry 170 and the carry 171 is one, the terminal count 184 and the terminal count 186 are delayed by one period of the base clock 154. If both of the carry 170 and the carry 171 are one, the terminal count 184 and the terminal count 186 are delayed by two periods of the base clock 154.

A vernier circuit 310 is coupled to receive the T2 terminal count 190 and the accumulated T2 vernier 127. The vernier circuit 310 adjusts the phase of the T2 terminal count 190 according to the accumulated T2 vernier 127 in order to generate the T2 marker 152.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for generating timing markers in an automatic electrical test system, comprising the steps of:
   receiving a first set of timing parameters corresponding to a first external period start, the first set of timing parameters comprising a first T1 value, a first T2 value, and a first period-minus-T1 value;
   generating a first internal period start, the first internal period start offset from the first external period start by the first T1 value;
   generating a first T1 marker and a first T2 marker, the first T1 marker offset from the first external period start by the first T1 value, the first T2 marker offset from the first internal period start by the first T2 value.

2. The method of claim 1, wherein the first T1 value comprises a first T1 counter value and a first T1 vernier value, and wherein the first T2 value comprises a first T2 counter value and a first T2 vernier value, and wherein the first period-minus-T1 value comprises a first period-minus-T1 counter value and a first period vernier value.

3. The method of claim 2, wherein the step of generating a first internal period start comprises the step of generating the first internal period start offset from the first external period start by the first T1 counter value.

4. The method of claim 2, wherein the step of generating a first internal period start comprises the step of generating a first T1 terminal count according to the first T1 counter value.

5. The method of claim 4, wherein the step of generating a first T1 marker and a first T2 marker comprises the steps of:
   delaying the first internal period start according to the first T1 vernier value;
   generating a first T2 terminal count according to the first T2 counter value;
   delaying the first T2 terminal count according to the first T2 vernier value.

6. The method of claim 2, further comprising the steps of:
   receiving a second set of timing parameters corresponding to a second external period start, the second set of timing parameters comprising a second T1 value, a second T2 value, and a second period-minus-T1 value;
   generating a second internal period start, the second internal period start offset from the first internal period start by the first period-minus-T1 value plus the second T1 value;
   generating a second T1 marker and a second T2 marker, the second T1 marker offset from the second internal period start by the second T1 value, the second T2 marker offset from the second internal period start by the second T2 value.

7. The method of claim 6, wherein the second set of timing parameters are synchronized by the first internal period start.

8. The method of claim 6, wherein the second T1 value comprises a second T1 counter value and a second T1 vernier value, and wherein the second T2 value comprises a second T2 counter value and a second T2 vernier value, and wherein the second period-minus-T1 value comprises a second period-minus-T1 counter value and a second period vernier value.

9. The method of claim 8, wherein the step of generating a second internal period start further comprises the steps of:
   generating an accumulated period vernier value equal to the first period vernier value plus the second period vernier value;
   determining an accumulated T1 vernier value equal to the second T1 vernier value plus the accumulated period vernier value;
   determining an accumulated T2 vernier value equal to the second T2 vernier value plus the accumulated period vernier value.

10. The method of claim 9, wherein the step of generating a second internal period start comprises the step of generating the second internal period start offset from the first internal period start by the first period-minus-T1 counter value plus the second T1 counter valve.

11. The method of claim 10, wherein the step of generating a second T1 marker and a second T2 marker comprises the steps of:
   delaying the second internal period start according to the accumulated T1 vernier value;

generating a second T2 terminal count according to the second T2 counter value;

delaying the second T2 terminal count according to the accumulated T2 vernier value.

12. An apparatus for generating timing markers in an automatic electrical test system, comprising:

means for receiving a first set of timing parameters corresponding to a first external period start, the first set of timing parameters comprising a first T1 value, a first T2 value, and a first period-minus-T1 value;

means for generating a first internal period start, the first internal period start offset from the first external period start by the first T1 value;

means for generating a first T1 marker and a first T2 marker, the first T1 marker offset from the first external period start by the first T1 value, the first T2 marker offset from the first internal period start by the first T2 value.

13. The apparatus of claim 12, wherein the first T1 value comprises a first T1 counter value and a first T1 vernier value, and wherein the first T2 value comprises a first T2 counter value and a first T2 vernier value, and wherein the first period-minus-T1 value comprises a first period-minus-T1 counter value and a first period vernier value.

14. The apparatus of claim 13, wherein the means for generating a first internal period start comprises means for generating the first internal period start offset from the first external period start by the first T1 counter value.

15. The apparatus of claim 13, wherein the means for generating a first internal period start comprises means for generating a first T1 terminal count according to the first T1 counter value.

16. The apparatus of claim 15, wherein the means for generating a first T1 marker and a first T2 marker comprises:

means for delaying the first internal period start according to the first T1 vernier value;

means for generating a first T2 terminal count according to the first T2 counter value;

means for delaying the first T2 terminal count according to the first T2 vernier value.

17. The apparatus of claim 13, further comprising:

means for receiving a second set of timing parameters corresponding to a second external period start, the second set of timing parameters comprising a second T1 value, a second T2 value, and a second period-minus-T1 value;

means for generating a second internal period start, the second internal period start offset from the first internal period start by the first period-minus-T1 value plus the second T1 value;

means for generating a second T1 marker and a second T2 marker, the second T1 marker offset from the second internal period start by the second T1 value, the second T2 marker offset from the second internal period start by the second T2 value.

18. The apparatus of claim 17, wherein the second set of timing parameters are synchronized by the first internal period start.

19. The apparatus of claim 17, wherein the second T1 value comprises a second T1 counter value and a second T1 vernier value, and wherein the second T2 value comprises a second T2 counter value and a second T2 vernier value, and wherein the second period-minus-T1 value comprises a second period-minus-T1 counter value and a second period vernier value.

20. The apparatus of claim 19, wherein the means for generating a second internal period start further comprises:

means for generating an accumulated period vernier value equal to the first period vernier value plus the second period vernier value;

means for determining an accumulated T1 vernier value equal to the second T1 vernier value plus the accumulated period vernier value;

means for determining an accumulated T2 vernier value equal to the second T2 vernier value plus the accumulated period vernier value.

21. The apparatus of claim 20, wherein the means for generating a second internal period start comprises means for generating the second internal period start offset from the first internal period start by the first period-minus-T1 counter value plus the second T1 counter value.

22. The apparatus of claim 21, wherein the means for generating a second T1 marker and a second T2 marker comprises:

means for delaying the second internal period start according to the accumulated T1 vernier value;

means for generating a second T2 terminal count according to the second T2 counter value;

means for delaying the second T2 terminal count according to the accumulated T2 vernier value.

23. A circuit for generating T1 and T2 timing markers in an automatic electrical test system, comprising:

first-in-first-out memory means coupled to receive and store a timing parameter address, the timing parameter address synchronized by an external period signal;

memory means storing a plurality of timing parameter entries, the memory means coupled to receive the timing parameter address from the first-in-first-out memory means, the timing parameter address synchronized by an internal period signal, the timing parameter address selecting one of the timing parameter entries;

adder circuit coupled to receive the timing parameter entries, the adder circuit generating a T1 marker value and a T2 marker value;

counter circuit coupled to receive the T1 marker value and the T2 marker value, the counter circuit generating the internal period signal, the T1 marker, and the T2 marker.

24. The circuit of claim 23, wherein each timing parameter entry comprises a T1 counter value, a T1 vernier value, a T2 counter value, a T2 vernier value, a period-minus-T1 counter value, and a period vernier value.

25. The circuit of claim 24, wherein the T1 marker value comprises a T1 count and an accumulated T1 vernier value, and wherein the T2 marker value comprises a T2 count and an accumulated T2 vernier value.

26. The circuit of claim 25, wherein the adder circuit comprises:

first adder means coupled to receive the period vernier value, the first adder means generating an accumulated period vernier value by adding the period vernier value and a delayed period vernier value;

second adder means coupled to receive the T1 vernier value and the accumulated period vernier value, the second adder means generating the accumulated T1 vernier value by adding the T1 vernier value and the accumulated period vernier value;

third adder means coupled to receive the T2 vernier value and the accumulated period vernier value, the third adder means generating the accumulated T2 vernier value by adding the T2 vernier value and the accumulated period vernier value;

fourth adder means coupled to receive a delayed period-minus-T1 counter value and the T1 counter value, the fourth adder means coupled to receive a delayed carry out from the first adder means, the fourth adder means generating the T1 count by adding the delayed period-minus-T1 counter value and the T1 counter value and the delayed carry out.

27. The circuit of claim 26, wherein the counter circuit comprises:

first counter means coupled to receive the T1 count and a base period signal, the first counter means counting down from the T1 count synchronized by the base period signal, the first counter means generating the internal period signal when the T1 count expires;

second counter means coupled to receive the T2 count and the base period signal, the second counter means counting down from the T2 count synchronized by the base period signal, the second counter means generating a T2 terminal count signal when the T1 count expires;

first vernier means coupled to receive the internal period signal and the accumulated T1 vernier value, the first vernier means generating the T1 marker by delaying the internal period signal according to the accumulated T1 vernier value;

second vernier means coupled to receive the T2 terminal count signal and the accumulated T2 vernier value, the second vernier means generating the T2 marker by delaying the T2 terminal count signal according to the accumulated T1 vernier value.

* * * * *